United States Patent [19]

Raggio et al.

[11] Patent Number: 5,073,240
[45] Date of Patent: Dec. 17, 1991

[54] ANHYDROUS ELECTROPHORETIC SILVER COATING TECHNIQUE

[75] Inventors: William A. Raggio, Del Mar; Frederick H. Elsner, Cardiff; Lawrence D. Woolf, Carlsbad, all of Calif.

[73] Assignee: General Atomics, San Diego, Calif.

[21] Appl. No.: 586,001

[22] Filed: Sep. 21, 1990

[51] Int. Cl.$^5$ ............................................. C25D 13/00
[52] U.S. Cl. ............................... 204/181.5; 204/181.4; 204/180.2
[58] Field of Search ................. 204/181.5, 37.1, 16, 204/182.1, 180.2

[56] References Cited

U.S. PATENT DOCUMENTS 3,860,506  1/1975  Nickerson ..................... 204/181.5
4,952,557  8/1990  Schmidt ........................ 204/182.1

*Primary Examiner*—John Niebling
*Assistant Examiner*—Caroline Koestner
*Attorney, Agent, or Firm*—Nydegger & Associates

[57] ABSTRACT

A process for depositing a silver coating onto a superconductor involves placing the superconductor into an alcohol solution, preferably octanol, which contains silver particles. Each silver particle is coated with a layer of oleic acid. An electrode, preferably made of silver, is also disposed in the anhydrous solution. A direct current voltage is then established on the electrode, which causes the silver particles to plate onto the superconductor. After electrophoresis, the now-plated superconductor is heated to nine hundred degrees centigrade (900° C.) for approximately one (1) minute.

17 Claims, 1 Drawing Sheet

ANHYDROUS ELECTROPHORETIC SILVER COATING TECHNIQUE

FIELD OF THE INVENTION

The present invention relates generally to processes for attaching a low resistance electrical contact to a substrate. More specifically, the present invention is useful for coating a substantially uniform, electrically conducting protective layer onto ceramic superconductors. The present invention is particularly, though not exclusively, useful in coating a coherent, low-resistance layer of silver onto a ceramic substrate.

BACKGROUND OF THE INVENTION

As is well-known, superconducting ceramics may be used for many applications. For all superconductor applications, however, electrical interconnections must somehow be made between the current carrying superconductor and other electrical components. For example, the source of energy and the load carried by the electrical energy must be operatively connected to the superconductor. Ideally, these interconnections have low resistance to electric current flow, to complement the energy transmission savings provided by the superconductor. Not just any electrically conducting element, however, is suitable for use as an electrical interconnector between the superconductor and either a source of electricity or a load. Besides having low electrical resistivity, the interface established between the interconnecting element and the superconductor should also have a low electrical contact resistance. This is because current can more easily bypass cracks in the superconductor structure by shunting through the interconnecting element when the interface between the superconductor and the interconnecting element has low electrical resistance. The element should also preferably be chemically non-reactive with the ceramic superconductor, to prevent undesired doping of the superconductor by the interconnecting element during the sintering process.

Moreover, the interconnecting element should also protectively coat the surface of the ceramic superconductor, to prevent diffusion of water or carbon dioxide into the ceramic superconductor. As is well known, when water or carbon dioxide diffuses into and thereby contaminates a ceramic superconductor, the superconducting properties of the contaminated ceramic are adversely affected. The protective coating provided by the interconnecting element, however, should allow certain other elements, such as oxygen, to diffuse through the coating and into the ceramic superconductor structure. Such oxygen diffusion is necessary in order to properly oxygenate the superconductor. As is well known in the art, oxygenation of the superconductor results in a more efficient superconducting transmission medium.

Silver is an element which is useful as a protective coating for a ceramic superconductor, because silver satisfies the criteria discussed above. To deposit a layer of silver onto a ceramic superconductor, a number of deposition methods can be used. One method which is relatively simple and inexpensive to use is electrophoresis. Electrophoresis has several advantages over other coating methods. First, a silver coating having a thickness of about three to thirty (3-30) microns can be relatively quickly deposited onto a substrate using electrophoresis. A silver coating three to thirty (3-30) microns thick provides adequate protection for the superconductor substrate. Also, a silver coating which is electrophoretically deposited onto a substrate can be heated to sinter the silver into a dense coating relatively quickly, as compared to the ordinarily longer heating times required to sinter silver when binder materials are used to adhere the silver to the substrate.

As is well-known, however, electrophoresis is ordinarily accomplished by placing the object to be coated into a waterbased solution in which the coating material is suspended and in which the coating material develops an electrical charge. An electrode is also positioned in the solution and a voltage is applied to the electrode to electrophoretically deposit the coating material onto the object to be coated. Unfortunately, as mentioned above, contact between a ceramic superconductor and water should be avoided, in order to prevent damage to the ceramic. Accordingly, existing electrophoresis methods which use a water-based solution are unsuitable for depositing silver onto a ceramic superconductor.

In light of the above discussion, it is an object of the present invention to provide a process for substantially completely and uniformly coating a superconductor ceramic with a material having relatively low electrical resistance. In addition, it is an object of the present invention to provide a process for coating a superconductor ceramic with a material which substantially prevents diffusion of water and carbon dioxide through the material into the superconductor ceramic. Moreover, it is an object of the present invention to provide a process for coating a superconductor ceramic with a material which permits the diffusion of oxygen through the material and into the superconductor ceramic, and which does not require the use of water during the process. Additionally, it is an object of the present invention to provide a process for coating a superconductor ceramic with a material which is relatively chemically inert vis-a-vis the superconductor ceramic material. Also, it is an object of the present invention to provide a process for coating a superconductor ceramic which does not chemically deteriorate the superconductor ceramic material. Finally, it is an object of the present invention to provide a process for coating a superconductor ceramic with a material that is relatively easy and cost effective to use.

SUMMARY OF THE INVENTION

A process for depositing a coating which has low electrical resistance onto a ceramic superconductor substrate includes electrophoretically depositing silver particles from a non-aqueous solution onto the superconductor substrate and subsequently sintering the silver particles to create a protective coating for the substrate. In order to provide a means for the silver particles to carry an electrical charge to facilitate electrophoresis, each of the silver particles is pre-coated with a surfactant agent. For example, oleic acid can be used for this purpose.

In accordance with the detailed process of the present invention, particles which are coated with oleic acid are suspended in a solution to form a slurry that is held in a container. Also, an electrode is positioned in the container and the superconductor substrate, which has a metallic wire core is grounded and is positioned to be drawn through the slurry in the container. Importantly, the solution is composed of an alcohol and is, preferably, anhydrous octanol. The slurry of alcohol solution and silver particles is subjected to electrophoresis. More particularly, a positive dc voltage of about twenty-five (25) volts is applied to the electrode as the substrate is drawn through the solution. The silver particles are electrically charged relative to the substrate due to the chemical interplay between the oleic acid coating on the silver particles and the anhydrous octanol. The silver particles in the slurry are consequently attracted to the metal core of the superconductor wire and accordingly are plated onto the superconductor substrate as the substrate is drawn through the container. Stated differently, the superconductor substrate is the cathode for the present electrophoresis process, and the electrode is the anode. Preferably, to prevent settling of the silver particles, the slurry is stirred or otherwise gently agitated during the electrophoresis process.

The alcohol which adheres to those portions of the superconductor substrate which have been drawn through the container is evaporated from the coated superconductor substrate and the superconductor substrate with silver coating is heated to a temperature in the approximate range of six hundred to nine hundred fifty degrees centigrade (600°–950° C.) for approximately one (1) minute or a time sufficient to sinter the coating. The preferred sintering temperature is approximately nine hundred degrees centigrade (900° C.). When the now silver-coated superconductor is so heated, the silver coating is sintered into a dense, electrically low-resistance layer having a thickness of about three to thirty (3–30) microns. After the above processes are completed, the coated superconductor may be heated to approximately four hundred degrees centigrade (400° C.) in an oxygen atmosphere for approximately one hour to one week, in order to oxygenate the superconductor structure as may be necessary.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
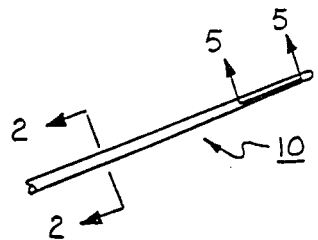
FIG. 1 is a perspective view of one embodiment of the product of the present invention.
Figure 2:
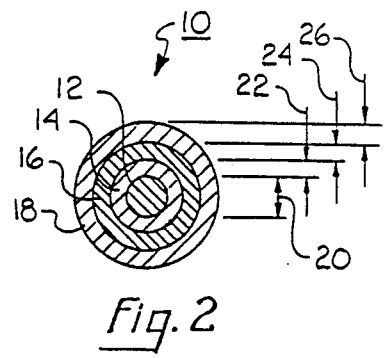
FIG. 2 is a cross-sectional view of the product of the present invention as seen along the line 2—2 in FIG. 1.

The silver electrodeposition method of the present invention can be used to adhere a protective silver coating onto a wide variety of substrates. One non-limiting example of a substrate which can be coated with silver using the present invention is shown in FIGS. 1 and 2, where a coated superconductor wire 10 is shown. More particularly, FIGS. 1 and 2 show a metal substrate 12, which, while not required by the present invention, has a protective layer 14 formed thereon. Substrate 12 supports a superconductor ceramic layer 16. For purposes of disclosure, it is to be understood that metal substrate 12, protective layer 14, and ceramic layer 16 are the input wire material 15 shown in FIG. 3, to be processed by the present invention. The embodiment of superconductor wire 10 shown in FIGS. 1 and 2 includes, in radial order, a substrate 12 having a diameter 20 of approximately fifty (50) to one hundred fifty (150) microns, a protective layer 14 having a thickness 22 of between one (1) and twenty (20) microns, and a ceramic layer 16 having a thickness 24 of approximately fifty (50) to one hundred fifty (150) microns.

It will be appreciated that the materials of coated superconductor 10 must provide for the superconductivity of electrical current, while maintaining adequate structural strength and flexibility. In particular, in reference to FIG. 2, substrate 12 is preferably made of a metallic material to provide a strong, oxidation-resistant, yet flexible platform for superconductor ceramic layer 16. For example, substrate 12 may be any suitable metallic alloy, such as Duranickel 301 or any of the metals listed in Table 1 below.

TABLE 1

| COMPOSITION OF WIRE SUBSTRATES (WEIGHT %) | | | | | | | | | |
| --- | --- | --- | --- | --- | --- | --- | --- | --- | --- |
| | Ni | Fe | Cr | Al | Si | Mn | Mg | Ti Zr | B |
| Duranickel 301 | 94.2 | | | 4.4 | 0.4 | 0.3 | | 0.4 | |
| Hoskins-875 | | 71.5 | 22.5 | 5.5 | 0.5 | | | | |
| Alumel | 94.8 | | | | 1.5 | 1.5 | 1.7 | | |
| Inconel-601 | 60 | 13 | 23 | 1.5 | 0.5 | 1.0 | | | |
| Haynes-214 | 76.5 | 3 | 16 | 4.5 | | | | | |
| Nisil | 95.5 | | | | | 4.4 | 0.1 | | |
| Nicrosil | 84.4 | | 14.2 | | | 1.4 | | | |
| Ni$_3$Al | 88.1 | | | 11.3 | | | | .6 | .02 |

Also, the alloys disclosed in co-pending U.S. patent application entitled "Nickel-Based Substrate for a Ceramic Superconductor", assigned to the same assignee as the present invention, may be used. Specifically, these alloys include $Ni_{1-x}Al_x$ ($0 \leq x \leq 0.25$); $Ni_xAl_yB_z$ ($0.6 \leq x, 0.1 \leq y \leq 0.25$, and $z \leq 0.1$); and $Ni_xAl_yCu_z$ ($0.6 \leq x$, $y \leq 0.25$, and $z \leq 0.15$).

In addition to the above material requirements, it can be readily appreciated by those skilled in the art that ceramic layer 16 is made of a suitable superconductor material, such as a rare earth-based ceramic which has the chemical formula $REBa_2Cu_3O_{7-x}$, where RE is an element selected from the group consisting of yttrium and elements having atomic numbers in the range of 57 to 71, inclusive, and combinations thereof, and x is in the range of zero (0) to one half (0.5). Alternatively, ceramic layer 16 may be made of a bismuth- (Bi) or thallium- (Tl) based superconductor. Importantly, protective layer 14 is a protective coating material which substantially inhibits interdiffusion of substrate 12 materials and ceramic layer 16 materials during such manufacturing processes as, for example, sintering ceramic layer 16 onto substrate 12. In the present invention, protective layer 14 is a layer of $NdBa_2Cu_3O_{7-x}$, where x is from zero (0) to one half (0.5), inclusive.

Lastly, FIG. 1 shows that after wire 10 is processed by the method of the present invention, wire 10 is protectively coated with a silver layer 18 that has a thickness 26 of between about three (3) and thirty (30) microns.

METHOD OF MANUFACTURE

Figure 3:
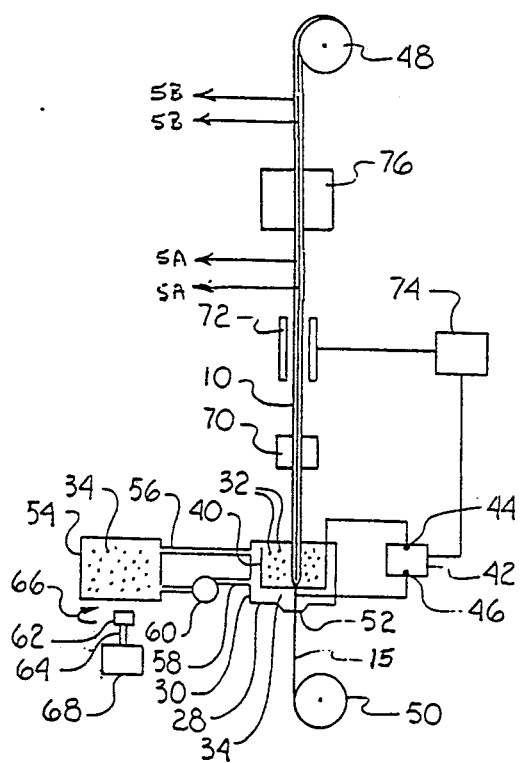
FIG. 3 is a schematic diagram of one embodiment of the apparatus used to perform the process of the present invention, with the thickness of the silver coating exaggerated for illustration purposes.

In describing the depositing of a silver layer, or coating, onto a ceramic substrate, reference is made to FIG. 3, which shows an example of one type of apparatus that may be used to deposit silver onto input wire 15. In particular, a glass or plastic container 28 is partially or completely filled with an alcohol solution 30. When silver is to be deposited onto a ceramic substrate, alcohol solution 30 is anhydrous to avoid water damage to ceramic superconductor layer 16. Alcohol solution 30 is composed of a heavy alcohol such as octanol or propanol, but preferably the solution 30 is octanol.

FIG. 3 also shows that a plurality of silver particles 32 are suspended in solution 30 to form a slurry 34. In order to apply a more uniform coating 18 onto input wire 15, it is desirable that silver particles 32 be uniformly distributed, i.e., dispersed, in solution 30. We have found that silver particles 32 are more uniformly dispersed in solution 30 when solution 30 is composed of a solvent which has a relatively high molecular weight. Accordingly, octanol, which has a higher molecular weight than propanol, is the preferred solvent. The concentration of the particles 32 in solution 30 is in the range of approximately fifty (50) to six hundred (600) grams of silver per liter of solution 30. Importantly, a relatively high silver concentration will result in a relatively thicker silver coating 18 for a given electrophoresis voltage, while a relatively lower silver concentration results in a relatively thinner silver coating 18.

Figure 4:
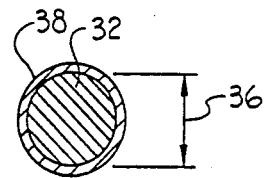
FIG. 4 is an enlarged cross-sectional view of a single coated silver particle of the present invention.

Referring briefly to FIG. 4, a single silver particle 32 is shown to have a diameter 36 of between one-half (0.5) and one and one-half (1.5) microns, although different-sized particles can be used. In particular, particles 32 can be silver particles marketed as Metz Metallurgical SED grade silver powder. Finally, FIG. 4 shows that each particle 32 is coated with a surfactant layer 38. In the preferred embodiment, surfactant layer 38 is a layer of oleic acid. Preferably, the weight ratio of oleic acid to silver is greater than approximately 1.3%. As can be appreciated by the skilled artisan, surfactant layer 38 reduces undesired agglomeration and settling of the silver particles 32 within solution 30. Also, surfactant layer 38 forms an electrical charge in the alcohol solution during the electrophoresis process to facilitate electrophoretic deposition of the particles 32 onto ceramic layer 16 of wire 10.

Referring back to FIG. 3, it will be seen that an electrode 40 is disposed in anhydrous solution 30. Electrode 40 is made of any suitable electrode material, and is preferably made of silver or copper. When a substantially cylindrical superconductor input wire 15 is to be coated with silver particles 32, electrode 40 can be an annular cylindrical jacket which surrounds wire 15 in solution 30, as shown in FIG. 3. To establish an electrophoresis solution, electrode 40 is connected to a direct current (dc) power supply 42. More particularly, one terminal 44 of power supply 42 is electrically connected to electrode 40 and the other terminal 46 of power supply 42 is electrically connected to input wire 15.

Power supply 42 is any suitable dc power supply which can establish an appropriate voltage, for example twenty-five (25) volts, between electrode 40 and wire 15. Electrophoretic voltages in the range of ten (10) to sixty (60) volts, preferably approximately twenty-five (25) volts, have been found to be effective.

With the above disclosure in mind, it will be appreciated that electrode 40 functions as the anode and that input wire 15 functions as the cathode of the present electrophoresis process. In addition, wire 15 may be stationarily disposed in container 28 during the electrophoresis process or, as shown in schematic in FIG. 3, mounted between a take up spool 48 and a supply spool 50 to continuously draw wire 15 through container 28. In the latter case, container 28 is formed with a water tight diaphragm 52 to provide a relatively leak-proof means of drawing wire 15 through container 28. Also, the rate at which wire 15 is drawn through container 28 is established to ensure that successive portions of wire 15 remain immersed in slurry 34 for a suitable time, typically five (5) to sixty (60) seconds.

Additionally, FIG. 3 shows that container 28 is connected in fluid communication with a vat 54 through fluid lines 56, 58. It is to be appreciated that vat 54 holds a volume of slurry 34 and that a pump 60 can circulate slurry 34 between vat 54 and container 28 to replenish slurry 34 in container 28. FIG. 3 also shows that a magnetic stirrer 62 is positioned adjacent container 28 for the purpose of gently agitating slurry 34 to prevent sedimentation of silver particles 32. Magnetic stirrer 62 stirs magnetic stir bar 64, immersed in slurry 34, to gently stir slurry 34. Importantly, slurry 34 is agitated relatively gently, in order to prevent separation of the surfactant layers 38 from the respective silver particles 32.

FIG. 3 also shows that silver-coated wire 10 is drawn through an oven 70 which heats wire 10 to about 200° C. to bake off excess solution 30 which adheres to wire 10. Baking off excess solution 30 facilitates measuring the thickness 26 of silver coating 18. To this end, a micrometer 72 is positioned adjacent wire 10 to measure the diameter of wire 10 and generate a signal representative of the thickness 26 of silver coating 18. Micrometer 72 is any suitable non-contact laser or optical micrometer well known in the art. The signal from micrometer 72 is sent to a microprocessor 74, which is in turn electrically connected to voltage source 42 to control the voltage sent by source 42 to electrode 40 and thus establish thickness 26 of silver coating 18. Finally, FIG. 3 shows that silver-coated wire 10 is passed through a furnace 76 which can heat wire 10 to about nine hundred degrees centigrade (900° C.) for about thirty (30) seconds to one (1) minute to sinter the silver coating 18.

Figure 5A:
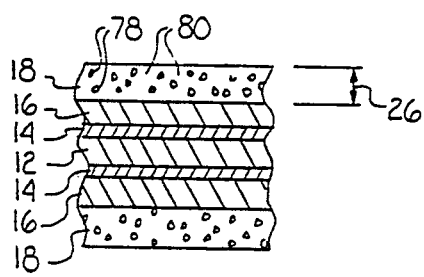
FIG. 5A is an enlarged cross-sectional view of the product shown in FIG. 1 as seen along the line 5A—5A in FIG. 3, showing the structure of the protective layer of the present invention before sintering.

Referring to FIG. 5A, the silver layer 18 is shown formed on ceramic layer 16 subsequent to the electrophoresis process disclosed above, but before silver layer 18 is sintered. More specifically, the silver layer 18 is formed in a plurality of structures 78 which are not substantially coherent or contiguous. The incoherency of the structures 78 results in the formation of diffusion paths 80, through which water or other impurities, such as solder or flux from subsequent soldering processes, could potentially diffuse and thereby damage ceramic layer 16. Moreover, the electrical conductivity of silver layer 18 is adversely affected by the presence of diffusion paths 80. To overcome the problems noted above associated with the presence of diffusion paths 80 in silver layer 18, coated ceramic layer 16 is heated in furnace 76 to between six hundred (600) and nine hundred fifty degrees centigrade (950° C.), preferably nine hundred degrees centigrade (900° C.). This high temperature sintering diffuses some silver into the superconductor, which forms a low resistance interface between ceramic layer 16 and silver layer 18, and also sinters the silver into the structure shown in FIG. 5B. There, it will be seen that after approximately one (1) minute of sintering at nine hundred degrees centigrade (900° C.), silver layer 18 is made of a plurality of substantially coherent, contiguous silver structures 82. The structures 82 are grown from the structures 78 during sintering and abut each other to thereby eliminate substantially all of the diffusion paths 80 (shown in FIG. 5A) that existed prior to sintering.

After the sintering process described above, coated superconductor 10 may be heated to approximately four hundred degrees centigrade (400° C.) for approximately one (1) day to one (1) week, to fully oxygenate ceramic layer 16 when layer 16 is formed from the $REBa_2Cu_3O_{7-x}$ superconductor. As is known in the art, such oxygenation of the crystalline structure of the superconducting ceramic enhances the ceramic's superconducting properties. The selection of silver to coat ceramic layer 16 may now be fully appreciated, because silver, while substantially preventing water diffusion, permits oxygen diffusion through silver layer 18 and onto ceramic layer 16.

Figure 5B:
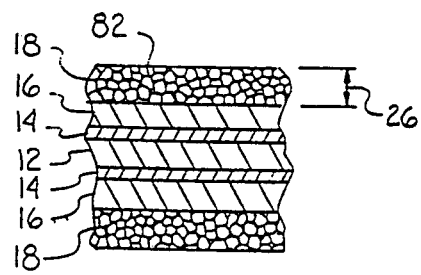
FIG. 5B is an enlarged cross-sectional view of the product shown in FIG. 1 as seen along the line 5B—5B in FIG. 3, showing the structure of the protective layer of the present invention after sintering.

In reference to FIGS. 2 and 5B, it is to be appreciated from the above disclosure that the thickness 26 of protective layer 18 will vary depending on the magnitude and duration of the voltage applied to electrode 40 and the length of time ceramic layer 16 is subjected to electrophoresis. The examples below provide illustration:

EXAMPLE [1]

A ceramic made of $Dyba_2Cu_3O_{7-x}$ was subjected to a direct current potential of twenty-five (25) volts for fifteen (15) seconds. The electrophoresis solution included octanol and had silver particles disposed in the octanol at a concentration of three hundred (300) grams of silver per liter of solution. Each of the silver particles had a coating of oleic acid. After electrophoresis, a silver layer approximately fifteen (15) microns thick has formed on the ceramic.

While the particular process for electrophoretically coating silver onto ceramic superconductors from nonaqueous solutions as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A process for electrophoretically depositing silver onto a substrate which comprises the steps of:
   (a) suspending a plurality of silver particles, each having a surfactant coating, in a solution at a predetermined concentration, said solution containing alcohol;
   (b) immersing said substrate in said solution;
   (c) positioning an electrode in said solution; and
   (d) applying a voltage between said substrate and said electrode to electrophoretically deposit said silver particles onto said substrate as said substrate is drawn through said solution.

2. A process for electrophoretically depositing silver onto a substrate as recited in claim 1 further comprising the steps of:
   (a) withdrawing said substrate from said solution;
   (b) substantially removing said alcohol from said substrate; and
   (c) sintering said silver.

3. A process as recited in claim 2 wherein said sintering step is accomplished by heating said silver to approximately 900° C. for approximately one minute.

4. A process as recited in claim 1 wherein said substrate contains a copper- and oxygen-containing superconductor ceramic.

5. A process as recited in claim 1 wherein said alcohol is anhydrous octanol.

6. A process as recited in claim 1 wherein said voltage is approximately twenty-five (25) volts.

7. A process as recited in claim 1 wherein said predetermined concentration of said silver particles is in the range fifty (50) to six hundred (600) grams of said silver per liter of said solution.

8. A process as recited in claim 1 wherein said solution is continuously agitated during said electrophoresis step.

9. A process as recited in claim 1 wherein said surfactant is oleic acid.

10. A process as recited in claim 1 wherein the weight percent of said surfactant to said silver particle is at least approximately 1.3.

11. A process for depositing a silver coating on a ceramic superconductor substrate, which comprises the steps of:
    (a) disposing said substrate in an alcohol solution containing silver particles having a surfactant coating;
    (b) positioning an electrode in said solution; and
    (c) applying a voltage between said substrate and said electrode to electrophoretically deposit said silver particles onto said substrate.

12. A process as recited in claim 11 wherein the concentration of said particles in said solution is in the range of fifty (50) to six hundred (600) grams of silver per liter of solution.

13. A process as recited in claim 12 further comprising the steps of:
    (A) withdrawing said substrate from said solution;
    (B) substantially removing said alcohol from said substrate; and
    (C) sintering said silver.

14. A process as recited in claim 13 wherein said sintering step is accomplished by heating said silver to approximately 900° C. for approximately one minute.

15. A process as recited in claim 11 wherein said substrate contains a copper- and oxygen-based superconductor ceramic and said alcohol is anhydrous octanol and said surfactant is oleic acid.

16. A process as recited in claim 11 wherein said voltage is approximately twenty-five (25) volts.

17. A process as recited in claim 11 wherein said solution is continuously agitated during said electrophoresis step.

* * * * *